US012764440B2

(12) United States Patent
Ramakrishnan

(10) Patent No.: US 12,764,440 B2
(45) **Date of Patent: *Oct. 13, 2026**

(54) IMAGE SENSORS HAVING DATA CONVERTERS WITH LOW NOISE COMPARATORS

(71) Applicant: SEMICONDUCTOR COMPONENTS INDUSTRIES, LLC, Scottsdale, AZ (US)

(72) Inventor: Shankar Ramakrishnan, Bangalore (IN)

(73) Assignee: SEMICONDUCTOR COMPONENTS INDUSTRIES, LLC C, Scottsdale, AZ (US)

( * ) Notice: Subject to any disclaimer, the term of this patent is extended or adjusted under 35 U.S.C. 154(b) by 70 days.

This patent is subject to a terminal disclaimer.

(21) Appl. No.: 18/982,095

(22) Filed: Dec. 16, 2024

(65) Prior Publication Data

US 2025/0119664 A1 Apr. 10, 2025

Related U.S. Application Data

(63) Continuation of application No. 18/056,755, filed on Nov. 18, 2022, now Pat. No. 12,207,009.

(51) Int. Cl.
*H04N 25/78* (2023.01)
*H03M 1/00* (2006.01)
(Continued)

(52) U.S. Cl.
CPC .............. *H04N 25/78* (2023.01); *H03M 1/00* (2013.01); *H03M 1/56* (2013.01); *H04N 25/709* (2023.01); *H04N 25/75* (2023.01)

(58) Field of Classification Search
CPC ...... H04N 25/78; H04N 25/709; H04N 25/75; H04N 25/60; H03M 1/00; H03M 1/56; H03M 1/123
See application file for complete search history.

(56) References Cited

U.S. PATENT DOCUMENTS

| | | | | |
|---|---|---|---|---|
| 12,207,009 B2 * | 1/2025 | Ramakrishnan | ........ | H03M 1/00 |
| 2004/0041927 A1 * | 3/2004 | Cho | ..................... | H04N 25/583 348/E3.018 |

(Continued)

FOREIGN PATENT DOCUMENTS

| | | |
|---|---|---|
| CN | 1909379 A | 2/2007 |
| CN | 114598826 A | 6/2022 |
| CN | 114979525 A | 8/2022 |

*Primary Examiner* — Timothy J Henn
(74) *Attorney, Agent, or Firm* — Brett J. Thompsen

(57) ABSTRACT

An image sensor may include an array of imaging pixels arranged in rows and columns. Each column of pixels can be coupled to a column analog-to-digital converter (ADC) via a pixel output line. The column ADC can include a first low noise single-ended comparison stage, a second low noise single-ended comparison stage, a latch circuit, and a counter. The first low noise single-ended comparison stage may include one or more current source transistors, a voltage ramp generator, a common source amplifier transistor, one or more autozero components, one or more capacitors such as a noise filtering capacitor, and a voltage clamping circuit. The voltage ramp generator can output an increasing voltage ramp or a decreasing voltage ramp.

20 Claims, 6 Drawing Sheets

(51) Int. Cl.

| | |
|---|---|
| ***H03M 1/56*** | (2006.01) |
| ***H04N 25/709*** | (2023.01) |
| ***H04N 25/75*** | (2023.01) |

(56) References Cited

U.S. PATENT DOCUMENTS

| | | | | |
|---|---|---|---|---|
| 2007/0182856 | A1* | 8/2007 | Wu ..................... | H03M 1/1023<br>348/695 |
| 2013/0009800 | A1* | 1/2013 | Yang ................... | H03F 3/45744<br>327/63 |
| 2013/0120622 | A1* | 5/2013 | Hiraoka ................. | H04N 25/78<br>348/294 |
| 2015/0288376 | A1* | 10/2015 | Gaalema .............. | H04N 25/772<br>341/172 |
| 2015/0357369 | A1 | 12/2015 | Kobayashi et al. | |
| 2017/0280077 | A1 | 9/2017 | Yun et al. | |
| 2017/0350756 | A1* | 12/2017 | Panicacci ............... | H04N 25/78 |

* cited by examiner

IMAGE SENSORS HAVING DATA CONVERTERS WITH LOW NOISE COMPARATORS

This application is a continuation of U.S. patent application Ser. No. 18/056,755, filed Nov. 18, 2022, which is hereby incorporated by reference herein in its entirety.

BACKGROUND

This relates generally to imaging systems and more specifically to image sensors having analog-to-digital converters.

An image sensor includes active image sensor pixels that generate image signals in response to incident light and readout circuitry for reading the image signals out from the active image sensor pixels. The readout circuitry can include analog-to-digital converters for converting analog signals output from the image sensor pixels into corresponding digital data.

The readout circuitry can sometimes be implemented using ramp analog-to-digital convers (ADCs). It can be challenging to design ramp ADCs for an image sensor. Image sensors employing a ramp ADC architecture can achieve a high bit resolution, but requires high-speed clocks. Conventional ramp ADCs include differential comparators, which result in higher noise levels and elevated power consumption. It is within this context that the embodiments herein arise.

DETAILED DESCRIPTION

Embodiments of the present technology relate to image sensors. It will be recognized by one skilled in the art that the present exemplary embodiments may be practiced without some or all of these specific details. In other instances, well-known operations have not been described in detail in order not to unnecessarily obscure the present embodiments.

Electronic devices such as digital cameras, computers, cellular telephones, and other electronic devices may include image sensors that gather incoming light to capture an image. The image sensors may include arrays of pixels, sometimes referred to as image sensor pixels or imaging pixels. The image sensor pixels include photosensitive elements such as photodiodes that convert the incoming light into image signals. Image sensors may include hundreds, thousands, or millions of imaging pixels. Image sensors may include control circuitry such as driver circuitry for selectively accessing the pixels and readout circuitry for reading out image signals corresponding to the electric charge generated by the photosensitive elements.

Figure 1:
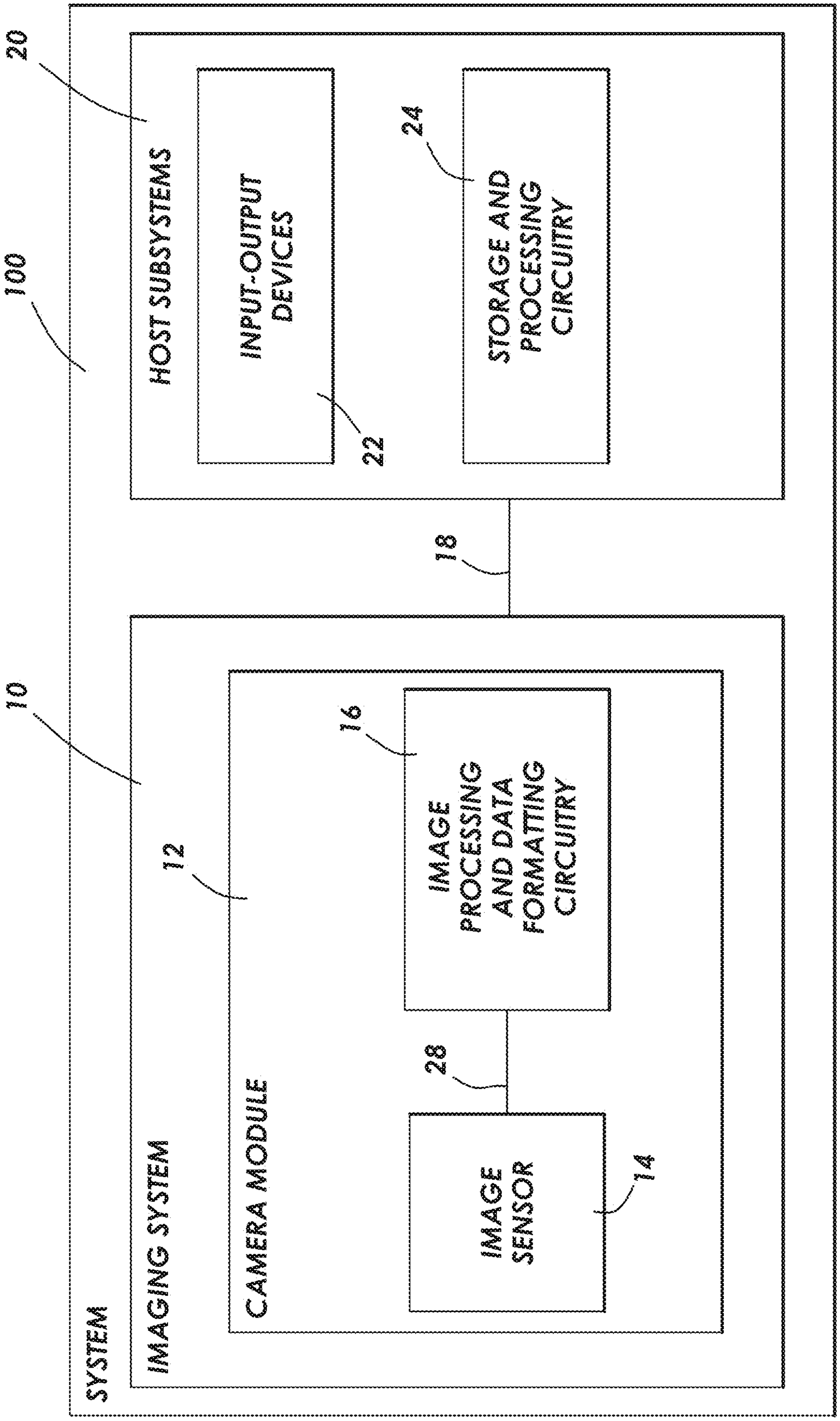
FIG. 1 is a diagram of an illustrative system having an image sensor in accordance with some embodiments.

FIG. 1 is a diagram of an illustrative imaging and response system including an imaging system that uses an image sensor to capture images. System 100 of FIG. 1 may be an electronic device such as a camera, a cellular telephone, a video camera, or other electronic device that captures digital image data, may be a vehicle safety system (e.g., an active braking system or other vehicle safety system), or may be a surveillance system.

As shown in FIG. 1, system 100 may include an imaging system such as imaging system 10 and host subsystems such as host subsystem 20. Imaging system 10 may include a camera such as camera module 12. Camera module 12 may include one or more image sensors 14, such as in an image sensor array integrated circuit, and one or more lenses. During image capture operations, each lens may focus light onto an associated image sensor 14. Image sensor 14 is sometimes referred to as an optical sensor. Image sensor 14 may include photosensitive elements such as image sensor pixels that convert incoming light into digital data. Image sensor 14 may include hundreds of pixels, thousands of pixels, millions of pixels, or any desired number of pixels.

Each image sensor in camera module 12 may be identical or there may be different types of image sensors in a given image sensor array integrated circuit. In some examples, image sensor 14 may further include bias circuitry, sample and hold circuitry, correlated double sampling (CDS) circuitry, amplifier circuitry, analog-to-digital converter circuitry, data output circuitry, memory, buffer circuitry, and/or addressing circuitry.

Still and video image data from image sensor 14 may be provided to image processing and data formatting circuitry 16 via path 28. Image processing and data formatting circuitry 16 may be used to perform image processing functions such as data formatting, adjusting white balance and exposure, implementing video image stabilization, or face detection. Image processing and data formatting circuitry 16 may additionally or alternatively be used to compress raw camera image files if desired (e.g., to Joint Photographic Experts Group or JPEG format).

In one example arrangement, such as a system on chip (SoC) arrangement, sensor 14 and image processing and data formatting circuitry 16 are implemented on a common semiconductor substrate (e.g., a common silicon image sensor integrated circuit die). If desired, sensor 14 and image processing circuitry 16 may be formed on separate semiconductor substrates. For example, sensor 14 and image processing circuitry 16 may be formed on separate substrates that are stacked vertically with respect to each other.

Imaging system 10 may convey acquired image data to host subsystem 20 over path 18. Host subsystem 20 may include input-output devices 22 and storage processing circuitry 24. Host subsystem 20 may include processing software for detecting objects in images, detecting motion of objects between image frames, determining distances to objects in images, or filtering or otherwise processing images provided by imaging system 10. For example, image processing and data formatting circuitry 16 of the imaging system 10 may communicate the acquired image data to storage and processing circuitry 24 of the host subsystems 20.

If desired, system 100 may provide a user with numerous high-level functions. In a computer or cellular telephone, for example, a user may be provided with the ability to run user applications. For these functions, input-output devices 22 of host subsystem 20 may include keypads, input-output ports, buttons, and displays and storage and processing circuitry 24. Storage and processing circuitry 24 of host subsystem 20 may include volatile and/or nonvolatile memory (e.g., random-access memory, flash memory, hard drives, solid-state drives, etc.). Storage and processing circuitry 24 may additionally or alternatively include microprocessors, microcontrollers, digital signal processors, and/or application specific integrated circuits.

Figure 2:
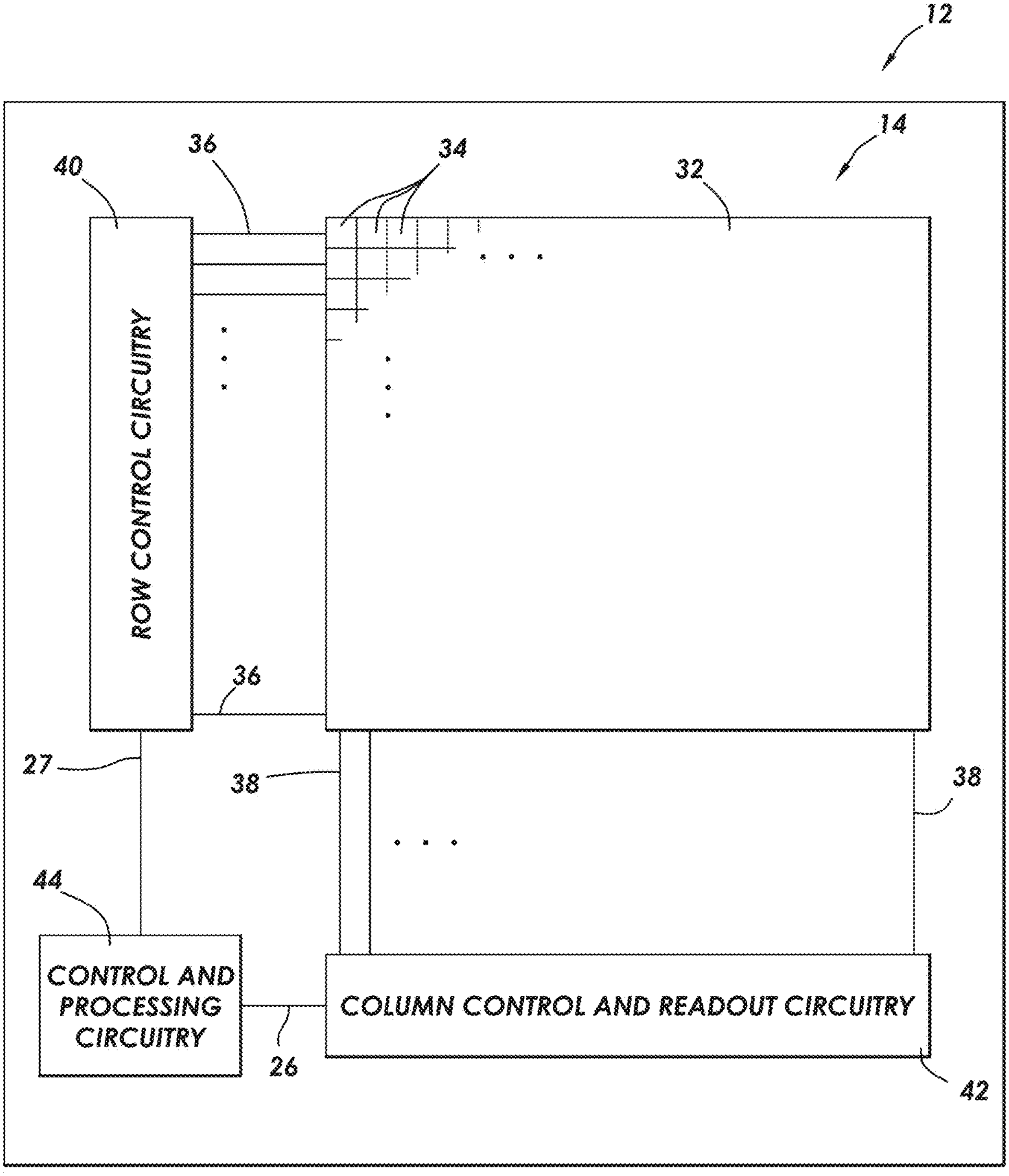
FIG. 2 is a diagram of an illustrative pixel array and associated row and column control circuitry for reading out signals from the pixel array in accordance with some embodiments.

An example of an arrangement of image sensor 14 of FIG. 1 is shown in FIG. 2. As shown in FIG. 2, image sensor 14 may include control and processing circuitry 44. Control and processing circuitry 44, sometimes referred to as control and processing logic, may be part of image processing and data formatting circuitry 16 in FIG. 1 or may be separate from circuitry 16. Image sensor 14 may include a pixel array such as array 32 of pixels 34. Pixels 34 are sometimes referred to herein as image sensor pixels, imaging pixels, or image pixels. Control and processing circuitry 44 may be coupled to row control circuitry 40 via control path 27 and may be coupled to column control and readout circuitry 42 via data path 26.

Row control circuitry 40 may receive row addresses from control and processing circuitry 44 and may supply corresponding row control signals to image pixels 34 over one or more control paths 36. The row control signals may include pixel reset control signals, charge transfer control signals, blooming control signals, row select control signals, dual conversion gain control signals, or any other desired pixel control signals.

Column control and readout circuitry 42 may be coupled to one or more of the columns of pixel array 32 via one or more conductive lines such as column lines 38. A given column line 38 may be coupled to a column of image pixels 34 in image pixel array 32 and may be used for reading out image signals from image pixels 34 and for supplying bias signals (e.g., bias currents or bias voltages) to image pixels 34. In some examples, each column of pixels may be coupled to a corresponding column line 38.

For image pixel readout operations, a pixel row in image pixel array 32 may be selected using row driver circuitry 40 and image data associated with image pixels 34 of that pixel row may be read out by column readout circuitry 42 on column lines 38. Column readout circuitry 42 may include column circuitry such as column amplifiers for amplifying signals read out from array 32, sample and hold circuitry for sampling and storing signals read out from array 32, analog-to-digital converter circuits for converting read out analog signals to corresponding digital signals, and/or column memory for storing the readout signals and any other desired data. Column control and readout circuitry 42 may output digital pixel readout values to control and processing logic 44 over line 26.

Pixel array 32 may have any number of rows and columns. In general, the size of image pixel array 32 and the number of rows and columns in array 32 will depend on the particular implementation of image sensor 14. While "rows" and "columns" are generally described herein as being horizontal and vertical, respectively, the terms rows and columns may be used interchangeably and can refer to any grid-like structure. Features described herein as "rows" may be arranged vertically and features described herein as "columns" may be arranged horizontally.

Pixel array 32 may be provided with a color filter array having multiple color filter elements which allows a single image sensor to sample light of different colors. As an example, image sensor pixels such as the image pixels in array 32 may be provided with a color filter array which allows a single image sensor to sample red, green, and blue (RGB) light using corresponding red, green, and blue image sensor pixels. The red, green, and blue image sensor pixels may be arranged in a Bayer mosaic pattern as an example. The Bayer mosaic pattern consists of a repeating unit cell of two-by-two image pixels, with two green image pixels diagonally opposite one another and adjacent to a red image pixel diagonally opposite to a blue image pixel. In another example, broadband image pixels having broadband color filter elements (e.g., clear color filter elements, yellow color filter elements, etc.) may be used instead of green pixels in a Bayer pattern. These examples are merely illustrative and, in general, color filter elements of any desired color and in any desired pattern may be formed over any desired number of image pixels 34.

Figure 3:
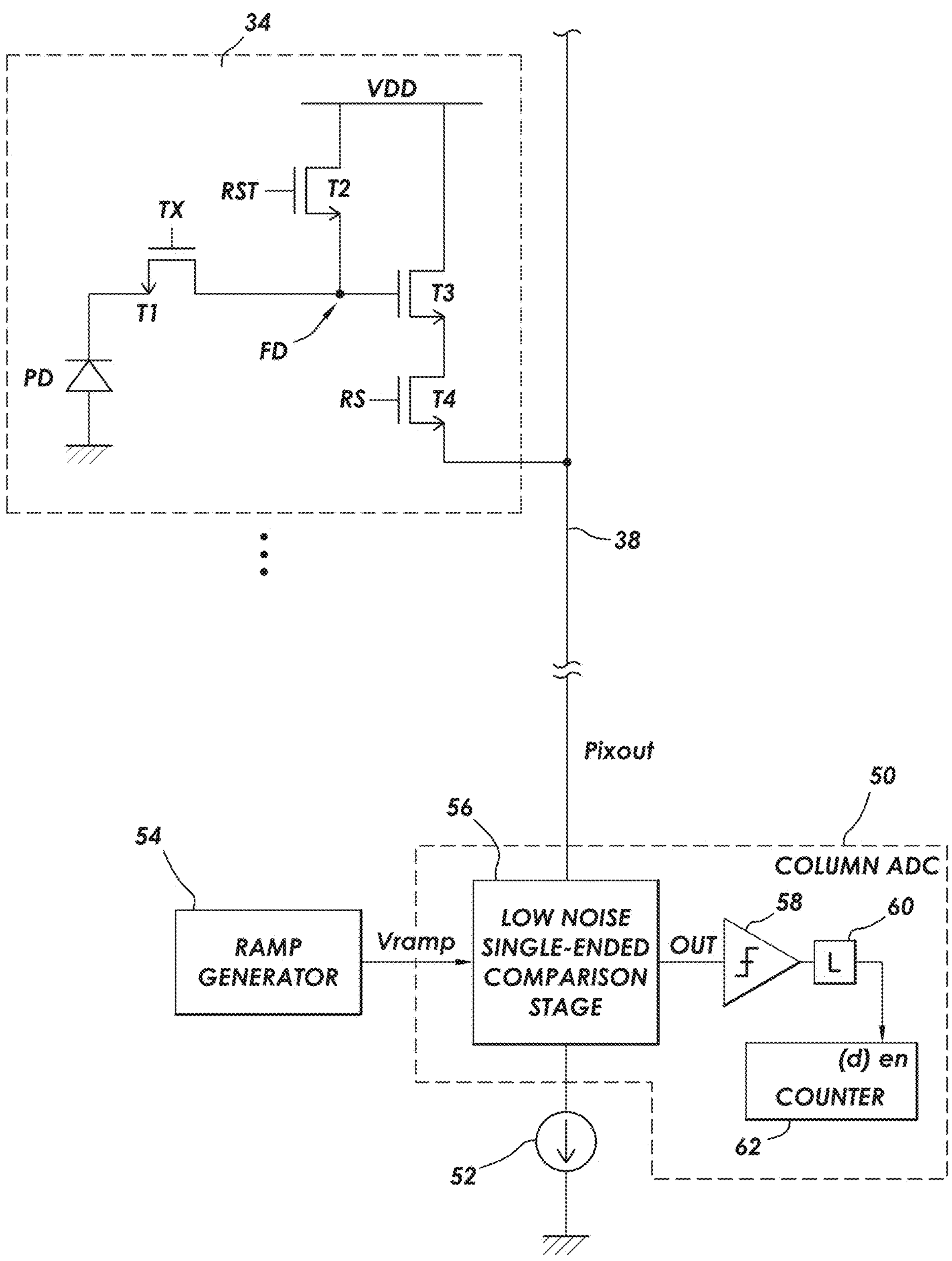
FIG. 3 is a diagram of a column of image sensor pixels coupled to an illustrative column analog-to-digital converter (ADC) circuit in accordance with some embodiments.

FIG. 3 is a diagram of a column of image sensor pixels coupled to an illustrative analog-to-digital converter (ADC) circuit 50 in accordance with some embodiments. Analog-to-digital converter 50 may represent one of the data converters within column readout circuitry 42 in FIG. 2. As shown in FIG. 3, an image sensor pixel such as pixel 34 may include a photosensitive element such as a photodiode PD and a charge transfer transistor such as charge transfer transistor T1 having a first source-drain terminal coupled to photodiode PD, a second source-drain terminal coupled to floating diffusion node FD, and a gate terminal configured to receive charge transfer control signal TX. Charge transfer transistor T1 is sometimes referred to as a charge transfer gate. Floating diffusion node FD is sometimes referred to as a floating diffusion region.

Pixel 34 may further include a reset transistor T2 having a drain terminal coupled to a positive power supply line (e.g., a power supply terminal on which positive power supply voltage VDD is provided), a source terminal coupled to floating diffusion node FD, and a gate terminal configured to receive a reset control signal RST. The terms "source" terminal and "drain" terminal when referring to current-conducting terminals of a metal-oxide semiconducting transistor can be used interchangeably and are sometimes referred to as "source-drain" terminals. For example, the drain terminal of reset transistor T2 can be referred to as its first source-drain terminal, and the source terminal of reset transistor T2 can be referred to as its second source-drain terminal, or vice versa.

Pixel 34 may also include a source follower transistor T3 having a drain terminal coupled to the positive power supply line, a gate terminal coupled to floating diffusion node FD, and a source terminal. Source follower transistor T3 is sometimes simply referred to as a "source follower." Pixel 34 may further include a row select transistor T4 having a drain terminal coupled to the source terminal of source follower T3, a gate terminal configured to receive a row select control signal RS, and a source terminal coupled to a corresponding column line 38. In the example of FIG. 3, transistors T1-T4 may all be n-type metal-oxide-semiconductor (NMOS) transistors. In other embodiments, at least some transistors T1-T4 can alternatively be implemented as p-type metal-oxide-semiconductor (PMOS) transistors. In yet other embodiments, pixel 34 can optionally include four or more n-channel and/or p-channel transistors. Although only one pixel 34 is shown in FIG. 3, any number of pixels 34 may be coupled to column line 38 for readout. For example, column line 38 may be coupled to more than 10 pixels in a column of pixels, 10-100 pixels in the column, hundreds of pixels in the column, or thousands of pixels in the column. Column line 38 is sometimes referred to as a pixel output line or a pixel output column line.

The example of FIG. 3 in which pixel 34 includes four transistor T1-T4 is also merely illustrative. In other embodiments, pixel 34 can include multiple photodiodes coupled to a shared floating diffusion node, fewer than four transistors, more than four transistors, five or more transistors, six or more transistors, one or more storage capacitors, one or more storage nodes, one or more mode switching transistors, multi-conversion gain components, bloom control components, and/or other pixel structures.

Pixel output line 38 may be coupled to a corresponding analog-to-digital converter (ADC) circuit 50 that is configured to convert an analog signal read out from a selected pixel to its digital equivalent. Pixel output line 38 may also be coupled to current source 52 that is configured to sink a relatively constant amount of current. ADC circuit 50 may be considered part of column readout circuitry 42 (see FIG. 2). Analog-to-digital converter circuit 50 can include one or more comparison stages such as first comparison stage 56 and second comparison 58, a latching circuit such as latch 60, and a counter circuit such as counter 62. The first comparison stage 56 may be configured to receive a voltage ramp signal Vramp from a voltage generator 54. ADC circuit 50 that receives ramp voltage Vramp is sometimes referred to as a ramp analog-to-digital converter.

First comparison stage 56 and second comparison stage 58 can be single-ended voltage comparison circuits. In contrast to single-ended voltage comparison circuits, differential voltage comparators include differential input transistors that typically result in higher noise levels and increased power consumption. Thus, relative to conventional differential comparators, the use of single-ended voltage comparison stages in column ADC 50 can be technically advantageous and provide benefits of reducing power consumption while minimizing the overall noise level of the column ADC 50. The first single-ended comparison stage 56 and the second single-ended comparison stage 58 are therefore sometimes collectively referred to as "low noise" comparison circuits.

Figure 4:
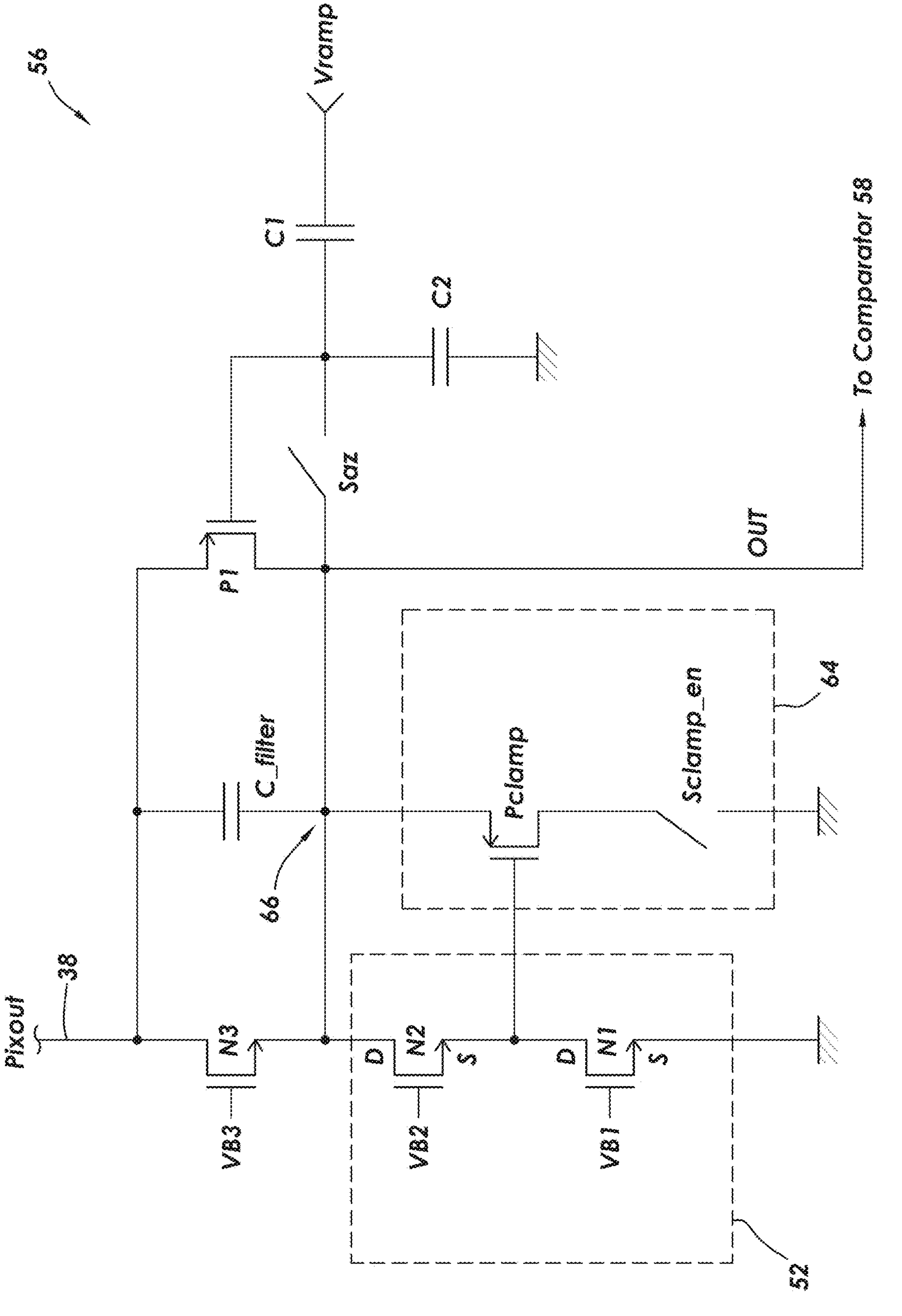
FIG. 4 is a circuit diagram of an illustrative low noise single-ended comparison stage in accordance with some embodiments.

Exemplary details of the first low noise comparison stage 56 are shown in FIG. 4. First low noise comparison stage 56 may generate an output signal OUT to the second low noise comparison stage 58. The second comparison stage 58 has a threshold comparison level THRES. The threshold level THRES of second comparison stage 58 can be fixed to some predetermined or known voltage level or can be adjusted. The second low noise comparison stage 58 can be a single-ended voltage comparator that receives signal OUT from first comparison stage 56 and can assert its output when the received OUT signal exceeds THRES. Comparator 58 has an output that is coupled to latch 60. Latch 60 may be a positive feedback latch (as an example) configured to provide a clean transition at its output. Latch 60 has an output that is coupled to an enable input of counter 62. When the output of latch 60 is at a first value, counter 62 is enabled and is allowed to keep counting. When the output of latch 60 is at a second value, counter 62 is disabled and will stop counting. The final count value output by counter 62 may be a function of the image signal read out from a selected pixel 34. ADC circuit 50 of the type shown in FIG. 3 can be included in any non-sampled ramp ADC designs in an image sensor.

FIG. 4 is a circuit diagram of illustrative low noise single-ended comparison stage 56 in accordance with some embodiments. As shown in FIG. 4, comparison stage 56 may be coupled to transistors N1 and N2 in current source 52. Transistors N1 and N2 may serve as cascode current source transistors and can be NMOS transistors. Current source transistor N1 has a source terminal coupled to a ground line (e.g., a ground power supply line on which a ground power supply voltage is provided), a gate terminal configured to receive a first bias voltage VB1, and a drain terminal. Cascode current source transistor N2 has a source terminal coupled to the drain terminal of transistor N1, a gate terminal configured to receive a second bias voltage VB2, and a drain terminal coupled to pixel output line 38. Current source transistors N1 and N2 are sometimes considered to be part of column ADC circuitry 50 or part of the first voltage comparison stage 56.

The first low noise voltage comparison stage 56 may include transistors N3 and P1, an autozero switch Saz, and capacitors C_filter, C1, and C2. Transistor N3 can be an NMOS transistor having a source terminal coupled to the drain terminal of the cascode current source transistor N2, a drain terminal coupled to pixel output line 38, and a gate terminal configured to receive a third bias voltage VB3. Transistor N3 can also be considered as part of current source 52. Bias voltages VB1, VB2, and VB3 should be chosen such that transistor N1 has a drain-to-source voltage (Vds1) that is greater than the saturation drain voltage Vdsat of N1 and such that transistor N2 has a drain-to-source voltage (Vds2) that is greater than the saturation drain voltage Vdsat of N2. Saturation drain voltage Vdsat is defined as the minimum drain-to-source voltage that is required to keep a transistor in saturation mode. The saturation mode is sometimes referred to as the constant current mode. Keeping Vds1 and Vds2 of transistors N1 and N2 above their respective Vdsat levels ensures that both of current source transistors N1 and N2 are operating in the constant current saturation mode. For example, Vds1 and Vds2 can be kept greater than 50 mV, greater than 100 mV, 100-200 mV, 150-200 mV, 175-250 mV, greater than 200 mV, greater than 250 mV, or greater than 300 mV. These biasing conditions may help ensure that there can be sufficient voltage swing on the pixel output line 38 during dark lighting scenarios and during bright charge saturation scenarios.

The node between transistors N2 and N3 is labeled as node 66 in FIG. 4. Transistor P1 can be a PMOS transistor having a source terminal coupled to the pixel output line 38, a drain terminal coupled to node 66, and a gate terminal. Capacitor C_filter may have a first terminal coupled to pixel output line 38 and a second terminal coupled to node 66. Arranged in this way, capacitor C_filter can be configured to filter out any wide-band and/or thermal noise associated with transistor P1. Capacitor C_filter can also be used to limit the slew rate at node 66 by absorbing any transient currents flowing through parasitic capacitances associated with transistor P1 to the ramp input to mitigate potential kickback from voltage perturbations at the gate of transistor P1. Capacitor C_filter is optional and can be omitted from stage 56 to help reduce circuit area. Capacitor can be 10 fF, 20 fF, 10-50 fF, 50-100 fF, less than 50 fF, more than 100 fF, several hundred femtofarads, or other capacitance to provide the desired filtering capabilities.

Transistor P1 can be configured to compare a voltage on the pixel output line 38 with the Vramp voltage. If transistor P1 is fully turned on, the output signal OUT at the drain terminal of P1 can be pulled up to be close to the voltage on line 38. If transistor P1 is turned off, the output signal OUT can drop to a value that is roughly equal to [VB3−VGS (N3)], where VGS(N3) represents the gate-to-source voltage across current source transistor N3. The value [VB3−VGS (N3)] is independent of an image signal readout level, so a low power and low noise comparator 58 can be used to compare signal OUT to a threshold level THRES. For example, [VB3−VGS(N3)] may be around the order of 600-700 mV, whereas the threshold level of comparator 58 can be set to a relatively higher voltage level of 800-900 mV. As another example, [VB3−VGS(N3)] may be around the order of 500-600 mV, whereas the threshold level of comparator 58 can be set to a relatively higher voltage level of 700-800 mV. As another example, [VB3−VGS(N3)] may be around the order of 800-900 mV, whereas the threshold level of comparator 58 can be set to a relatively higher voltage level of 1-1.1 V. Threshold level THRES should be lower than the lowest voltage of the pixel output line 38 corresponding to the saturation value of the pixel under the bright light scenario. Transistor P1 operated in this way is sometimes referred to and defined as a "common source" amplifier transistor.

Autozero switch Saz can be coupled across the gate and drain terminals of transistor P1. Capacitor C1 has a first terminal coupled to the gate of transistor P1 and has a second terminal configured to receive a ramp voltage signal Vramp from voltage generator 54 (see FIG. 3). Capacitor C2 has a first terminal coupled to the gate terminal of transistor P1 and has a second terminal coupled to a ground power supply, sometimes referred to as a ground line or ground. Capacitor C1 can serve as an autozero capacitor. The autozero switch Saz can be turned on with Vramp set to a middle of the sample-and-hold-reset ramp range so that output signal OUT can trip close to that value, independent of the pixel reset value. Capacitor C2 can be used in conjunction with capacitor C1 as a capacitive voltage divider to attenuate voltage Vramp. Attenuating signal Vramp in this way can be technically advantageous by providing analog gain, which can help suppress the ramp and quantization noise in comparator stage 56. Capacitor C2 is optional and can be omitted.

The first voltage comparison stage 56 can also include a clamping circuit such as voltage clamping circuit 64. Clamping circuit 64 may include a clamping transistor Pclamp and a clamp enable switch Sclamp_en. Clamping transistor Pclamp may be a PMOS transistor having a source terminal coupled to node 66, a gate terminal coupled to a node between current source transistors N1 and N2, and a drain terminal coupled to ground via switch Sclamp_en. Clamping circuit 64 can be enabled, by making the ramp voltage same as the voltage value during the autozero phase and activating switch Sclamp_en, at the end of a charge transfer phase to help pull the voltage on pixel output line 38 down to the reset voltage level. This will help the pixel output line 38 settle faster at the end of the charge transfer phase if its voltage becomes higher than the reset level during the charge transfer phase due to feedthrough from the transfer gate T2 to the source follower T3 in FIG. 3. The threshold voltage of Pclamp should have a magnitude greater than approximately Vb3-Vb2 so that it turns off once the pixel output line 38 drops to the reset voltage level. Clamping circuit 64 is optional and can be omitted.

Figure 5:
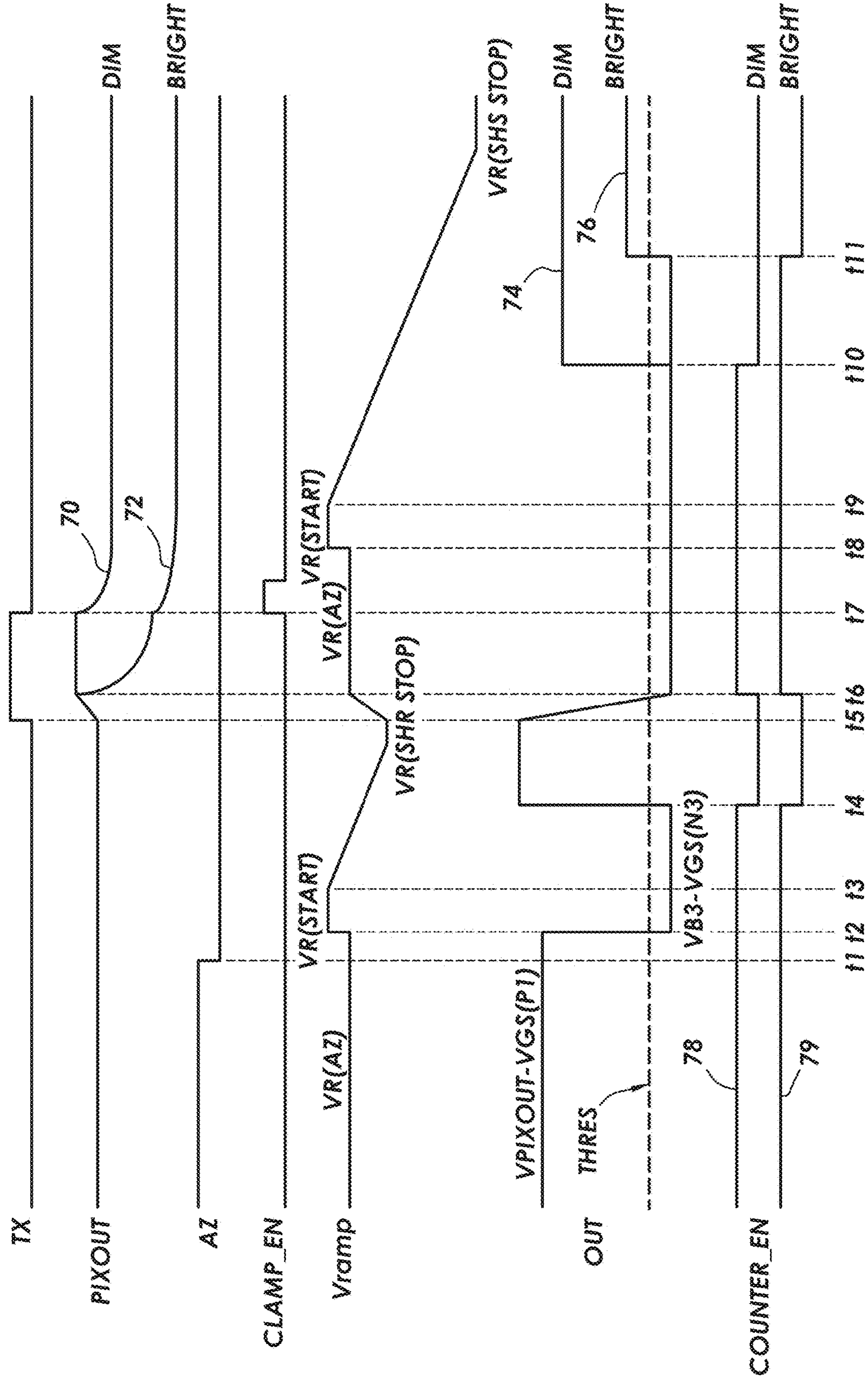
FIG. 5 is a timing diagram illustrating the operation of an analog-to-digital converter of the type shown in FIGS. 2-4 using a decreasing voltage ramp in accordance with some embodiments.

The operation of ADC circuit 50 of the type described in connection with FIGS. 2-4 is best understood in conjunction with the timing diagrams of FIGS. 5 and 6. FIG. 5 is a timing diagram illustrating the operation of analog-to-digital converter 50 using a decreasing Vramp. Waveform TX represents the signal for controlling charge transfer transistor T1 (see FIG. 3). Waveform PIXOUT represents the voltage at the pixel output column line 38. Waveform AZ represents the signal for activating the autozero switch Saz. Waveform CLAMP_EN represents the signal for activating the clamping switch Sclamp_en. Waveform Vramp represents the ramp signal output from the ramp generator. Waveform OUT represents the signal at the output of the low noise single-ended comparison stage 56. Waveform COUNTER_EN represents the signal output by latch 60 that is used to selectively enable and disable counter 62. Waveform 78 represents the counter enable signal for a dim light scenario, whereas waveform 79 may represent the counter enable signal for a bright light scenario.

Prior to time t1, autozero signal AZ may be asserted to turn on switch Saz. At this time, the Vramp voltage may be set to an autozero voltage level VR(AZ) that is less than the maximum Vramp voltage of VR(START). For example, autozero voltage level VR(AZ) may be 100 mV less than the maximum ramp start level VR(START). This is merely illustrative. In other embodiments, autozero voltage level VR(AZ) may be 120 mV less than VR(START), 150 mV less than VR(START), 100-200 mV less than VR(START), 50-100 mV less than VR(START), 200-250 mV less than VR(START), or other suitable voltage level less than VR(START). At this time, signal OUT may be pulled up or set to [VPIXOUT−VGS(P1)], where VPIXOUT represents the voltage level at output line 38 and were VGS(P1) represents the gate-to-source voltage across transistor P1. Capacitor C1 may also be charged up to store an autozero value. The time period during which autozero switch Saz is turned on is sometimes referred to as an autozeroing phase.

At time t1, the autozero signal AZ may be deasserted to turn off switch Saz. At time t2, the Vramp signal may be set to its maximum voltage level VR(START). Raising Vramp in this way can turn off transistor P1, which allows current source transistors N1 and N2 to pull signal OUT down to [VB3−VGS(N3)], where VGS(N3) represents the gate-to-source voltage across transistor N3.

At time t3, the Vramp signal may begin ramping down. This first voltage ramp for converting a reset voltage level on the pixel output line 38 is sometimes referred to as an SHR (sample-and-hold reset) ramp. Voltage Vramp will keep decreasing and at time t4, transistor P1 may be turned on again. When transistor P1 is turned on, signal OUT will rise above the threshold level THRES of the second comparator stage 58. This will cause comparator 58 to trip, thereby causing the counter enable signal output from latch 60 to be deasserted. Deasserting the counter enable signal can stop counter 62 from incrementing further. The final count value generated by counter 62 at time t4 is thus a function of the reset signal read out from the selected pixel. After time t4, the Vramp signal may continue to decrease until it reaches its first ramp stop voltage level VR(SHR STOP).

At time t5, the charge transfer control signal TX may be pulsed high. The time period during which signal TX is asserted is sometimes referred to as the charge transfer phase. At this time, the PIXOUT signal may initially increase, and the Vramp signal may rise back up to either VR(AZ) if the voltage clamping circuit 64 is present, or otherwise to VR(START). As signal Vramp increases, transistor P1 will be turned off, so signal OUT will again be driven down to [VB3−VGS(N3)], where VGS(N3) represents the gate-to-source voltage across transistor N3.

At time t6, the PIXOUT signal may either stay high as indicated by waveform 70 in a dim light scenario or may begin dropping as indicated by waveform 72 in a bright light scenario. At time t6, the counter enable signal COUN- TER_EN may be asserted to allow counter 62 to start incrementing again, and the Vramp signal may reach VR(AZ) if clamping circuit 64 is present (as shown) or may rise otherwise to VR(START). Counter 62 may optionally be reset prior to time t6 to help distinguish between the SHR count value and the SHS (sample-and-hold signal) count value. Alternately, counter 62 may have its bits inverted prior to time t6 to carry out the subtraction of the SHR count value from the SHS count value.

At time t7, the charge transfer control signal TX may be deasserted to signal the end of the charge transfer phase. At time t7, the PIXOUT waveform may begin dropping in both dim light and bright light scenarios, as shown by waveforms 70 and 72. At time t7, signal CLAMP_EN can be pulsed high to temporarily activate clamping circuit 64, if included within comparator stage 56. Turning on clamping circuit 64 can help the PIXOUT voltage settle more quickly to the actual SHS value. If the clamping circuit 64 is present, the Vramp signal should rise further to the VR(START) value (see time t8).

At time t9, the Vramp signal may begin ramping down again. This second voltage ramp for converting an image signal voltage level on the pixel output line 38 is sometimes referred to as an SHS (sample-and-hold signal) ramp. Voltage Vramp will keep decreasing and at some point, transistor P1 may be turned on again. The duration of the time period between t8 and the time that transistor P1 is activated may depend on the actual signal voltage read out on the pixel output line 38.

In the dim light scenario as shown by counter enable waveform 78, transistor P1 may be turned on at time t10. When transistor P1 is turned on at time t10, signal OUT will rise above the threshold level THRES of the second comparator stage 58 as shown by waveform 74. This will cause comparator 58 to trip, thereby causing the counter enable signal output from latch 60 to be deasserted. Deasserting the counter enable signal can stop counter 62 from incrementing further. The final count value generated by counter 62 at time t9 is thus a function of the dim signal value read out from the selected pixel.

In the bright light scenario as shown by counter enable waveform 79, transistor P1 may be turned on later at time t11. When transistor P1 is turned on at time t11, signal OUT will rise above the threshold level THRES of the second comparator stage 58 as shown by waveform 76. This will cause comparator 58 to trip, thereby causing the counter enable signal output from latch 60 to be deasserted. Deasserting the counter enable signal can stop counter 62 from incrementing further. The final count value generated by counter 62 at time t11 is thus a function of the bright signal value read out from the selected pixel. After time t11, the Vramp signal may continue to decrease until it reaches its second ramp stop voltage level VR(SHS STOP). The second ramp stop voltage level VR(SHS STOP) may be lower than the first ramp stop voltage level VR(SHR stop). This is merely illustrative. In other embodiments, the first ramp stop voltage level VR(SHR STOP) may be equal to the second ramp stop voltage level VR(SHS STOP).

The slope of the first SHR ramp following time t3 may be equal to the slope of the second SHS ramp following time t8. The SHR ramp is sometimes referred to as the ramp voltage used during an SHR conversion phase or operation, whereas the SHS ramp is sometimes referred to as the ramp voltage used during an SHS conversion phase or operation. This is exemplary. In some embodiments, the slope of the first SHR ramp following time t3 may be different than the slope of the second SHS ramp following time t9. As another example, the slope of the first SHR ramp following time t3 may be greater than the slope of the second SHS ramp following time t9. As yet another example, the slope of the first SHR ramp following time t3 may be less than the slope of the second SHS ramp following time t9.

Figure 6:
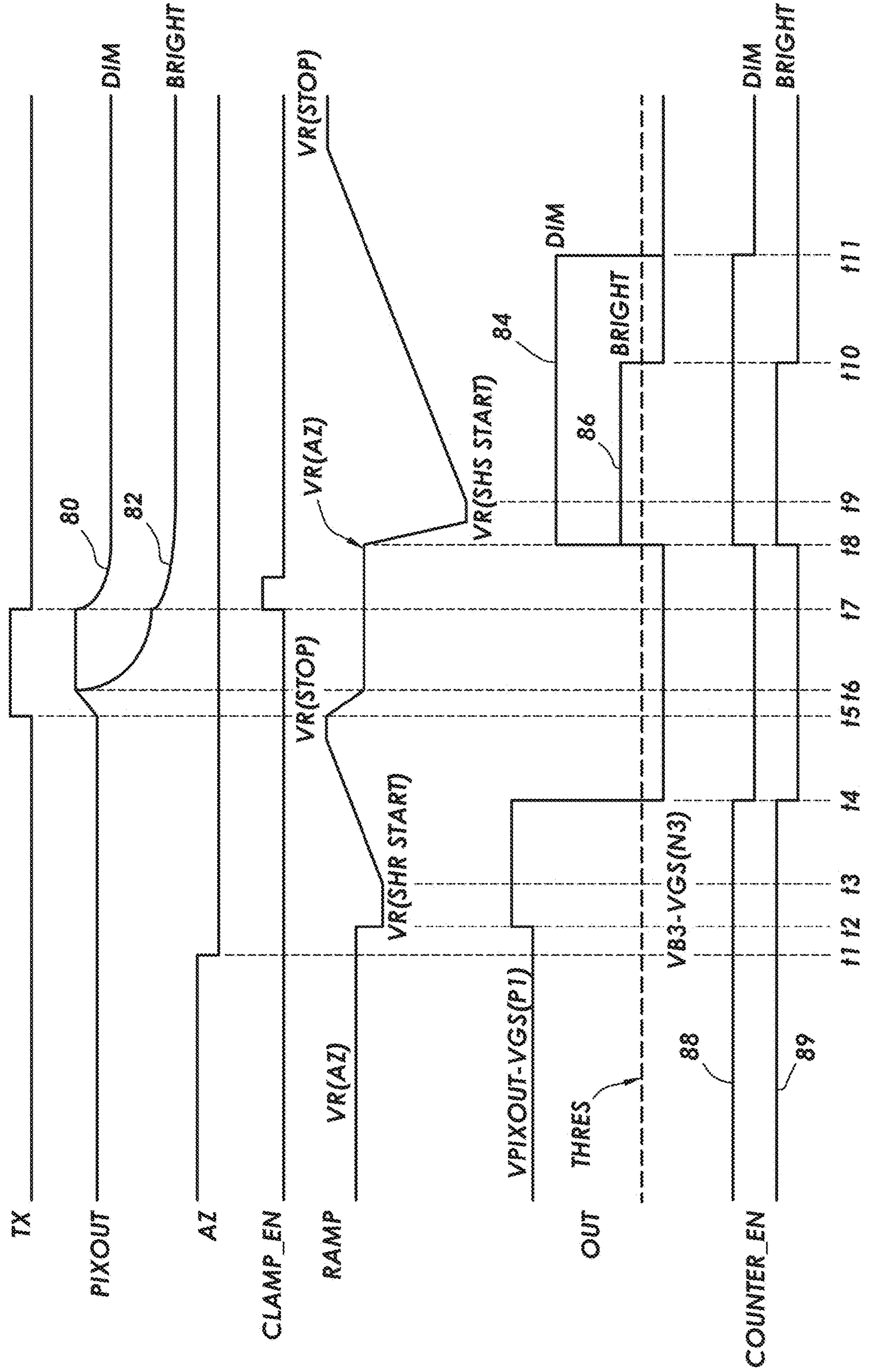
FIG. 6 is a timing diagram illustrating the operation of an analog-to-digital converter of the type shown in FIGS. 2-4 using an increasing voltage ramp in accordance with some embodiments.

FIG. 6 is a timing diagram illustrating the operation of analog-to-digital converter 50 using an increasing Vramp. An increasing Vramp may be technically advantageous by allowing more time for the pixel output line to settle during the SHS ramp under dim or dark lighting conditions. Waveform COUNTER_EN represents the signal output by latch 60 that is used to selectively enable and disable counter 62. Waveform 88 represents the counter enable signal for a dim light scenario, whereas waveform 89 may represent the counter enable signal for a bright light scenario.

Prior to time t1, autozero signal AZ may be asserted to turn on switch Saz. At this time, the Vramp voltage may be set to an autozero voltage level VR(AZ) that is greater than a first ramp start voltage VR(SHR START). For example, autozero voltage level VR(AZ) may be 100 mV greater than the first ramp start voltage VR(SHR START). This is merely illustrative. In other embodiments, autozero voltage level VR(AZ) may be 120 mV greater than VR(SHR START), 150 mV greater than VR(SHR START), 100-200 mV greater than VR(SHR START), 50-100 mV greater than VR(SHR START), 200-250 mV greater than VR(SHR START), or other suitable amount of voltage greater than VR(SHR START). At this time, signal OUT may be pulled up or set to [VPIXOUT−VGS(P1)], where VPIXOUT represents the voltage level at output line 38 and were VGS(P1) represents the gate-to-source voltage across transistor P1. Capacitor C1 may also be charged up to store an autozero value. The time period during which autozero switch Saz is turned on is sometimes referred to as the autozeroing phase.

At time t1, the autozero signal AZ may be deasserted to turn off switch Saz. At time t2, the Vramp signal may be set to its first ramp start voltage level VR(SHR START). Lowering Vramp in this way can turn on transistor P1, which can pull signal OUT to a higher voltage level as shown in FIG. 6.

At time t3, the Vramp signal may begin ramping up from VR(SHR START). This first voltage ramp for converting a reset voltage level on the pixel output line 38 is sometimes referred to as an SHR (sample-and-hold reset) ramp. Voltage Vramp will keep increasing and at time t4, transistor P1 may be turned off again. When transistor P1 is turned off, current source transistors N1 and N2 will pull signal OUT down to [VB3−VGS(N3)], where VGS(N3) represents the gate-to-source voltage across transistor N3. Signal OUT falling below the threshold level THRES of the second comparator stage 58 will cause comparator 58 to trip, thereby causing the counter enable signal output from latch 60 to be deasserted. Deasserting the counter enable signal can stop counter 62 from incrementing further. The final count value generated by counter 62 at time t4 is thus a function of the reset signal read out from the selected pixel. After time t4, the Vramp signal may continue to increase until it reaches a ramp stop voltage level VR(STOP). At time t5, the charge transfer control signal TX may be pulsed high. The time period during which signal TX is asserted is sometimes referred to as the charge transfer phase. At this time, the PIXOUT signal may initially increase and the Vramp signal may fall back down to either VR(AZ) if the voltage clamping circuit 64 is present as shown at time t6, or otherwise to VR(SHS START). After time t6, the PIXOUT signal may either stay high as indicated by waveform 80 in a dim light scenario or may begin dropping as indicated by waveform 82 in a bright light scenario.

At time t7, the charge transfer control signal TX may be deasserted to signal the end of the charge transfer phase. At time t7, the PIXOUT waveform may begin dropping in both dim light and bright light scenarios, as shown by waveforms 80 and 82. At time t7, signal CLAMP_EN can be pulsed high to temporarily activate clamping circuit 64, if included within comparator stage 56. Turning on clamping circuit 64 can help the PIXOUT voltage settle more quickly to the actual SHS value.

At time t8, the counter enable signal COUNTER_EN may be asserted to allow counter 62 to start incrementing again, and the Vramp signal should fall further to a second ramp start voltage level VR(SHS START). In the example of FIG. 6, second ramp start voltage VR(SHS START) may be less than first ramp start voltage VR(SHR START). This is merely illustrative. In other embodiments, second ramp start voltage VR(SHS START) may be equal to or may be greater than the first ramp start voltage VR(SHR START). Lowering Vramp in this way can turn on transistor P1, which can pull signal OUT to a higher voltage level depending on the actual signal read out from the selected pixel.

In the dim light scenario as shown by counter enable waveform 88, signal OUT will rise above the threshold level THRES of the second comparator stage 58 as shown by waveform 84, and counter 62 may be counting again. Counter 62 may optionally be reset prior to time t8 to help distinguish between the SHR count value and the SHS (sample-and-hold signal) count value. Alternately, counter 62 may have its bits inverted prior to time t6 to carry out the subtraction of the SHR count value from the SHS count value. In the bright light scenario as shown by counter enable waveform 89, signal OUT will rise above the threshold level THRES of the second comparator stage 58 as shown by waveform 86, and counter 62 may be counting again.

At time t9, the Vramp voltage may start ramping up from the second ramp start voltage VR(SHS START). In the bright light scenario, transistor P1 may be turned off at time t10. When transistor P1 is turned off at time t10, signal OUT will fall below the threshold level THRES of the second comparator stage 58 as shown by waveform 86. This will cause comparator 58 to trip, thereby causing the counter enable signal output from latch 60 to be deasserted. Deasserting the counter enable signal can stop counter 62 from incrementing further. The final count value generated by counter 62 at time t10 is thus a function of the bright signal value read out from the selected pixel.

In the dim light scenario, transistor P1 may be turned off later at time t11. When transistor P1 is turned off at time t11, signal OUT will fall below the threshold level THRES of the second comparator stage 58 as shown by waveform 84. This will cause comparator 58 to trip, thereby causing the counter enable signal output from latch 60 to be deasserted. Deasserting the counter enable signal can stop counter 62 from incrementing further. The final count value generated by counter 62 at time t11 is thus a function of the dim signal value read out from the selected pixel. After time t11, the Vramp signal may continue to increase until it reaches the ramp stop voltage level VR(STOP).

The slope of the first increasing SHR ramp following time t3 may be equal to the slope of the second increasing SHS ramp following time t9. This is exemplary. In some embodiments, the slope of the first SHR ramp following time t3 may be different than the slope of the second SHS ramp following time t9. As another example, the slope of the first SHR ramp following time t3 may be greater than the slope of the second SHS ramp following time t9. As yet another example, the slope of the first SHR ramp following time t3 may be less than the slope of the second SHS ramp following time t9.

The foregoing is merely illustrative and various modifications can be made to the described embodiments. The foregoing embodiments may be implemented individually or in any combination.

What is claimed is:

1. An image sensor comprising:

a pixel output line;

a plurality of pixels coupled to the pixel output line; and a data converter having:

a first comparator stage having an input formed by a single-ended input transistor and coupled to the pixel output line;

a second comparator stage coupled to an output of the first comparator stage;

a latch configured to receive a signal from the second comparator stage; and a counter configured to receive a signal from the latch.

2. The image sensor of claim 1, wherein the first comparator stage comprises a first single-ended comparator and wherein the second comparator stage comprises a second single-ended comparator.

3. The image sensor of claim 1, wherein the first comparator stage is configured to receive a ramp voltage.

4. The image sensor of claim 3, wherein the first comparator stage comprises:

a transistor having a gate terminal configured to receive the ramp voltage and having a source-drain terminal coupled to the pixel output line.

5. The image sensor of claim 4, wherein the first comparator stage further comprises:

a plurality of current source transistors coupled to the pixel output line, wherein the transistor has an additional source-drain terminal coupled between a pair of current source transistors in the plurality of current source transistors.

6. The image sensor of claim 4, wherein the transistor comprises an additional source-drain terminal coupled to the second comparator stage.

7. The image sensor of claim 4, wherein the first comparator stage further comprises:

a filter capacitor coupled in parallel with the transistor.

8. The image sensor of claim 4, wherein the first comparator stage further comprises:

a voltage clamp having a first terminal coupled to an additional source-drain terminal of the transistor and having a second terminal coupled to a power supply line.

9. A data converter operable with an image sensor pixel, comprising:

a first comparison stage configured to receive a signal, via a pixel output line, from the image sensor pixel and to generate a corresponding output signal; and a second comparison stage configured to receive the output signal from the first comparison stage, wherein the first comparison stage comprises a common source amplifier transistor having a first source-drain terminal coupled to the pixel output line and having a second source-drain terminal on which the output signal is produced.

10. The data converter of claim 9, wherein the common source amplifier transistor further comprises a gate terminal configured to receive a ramp voltage.

11. The data converter of claim 9, wherein the first comparator stage comprises a first single-ended comparator and wherein the second comparator stage comprises a second single-ended comparator.

12. The data converter of claim 9, further comprising:

a latch configured to receive a signal from the second comparator stage.

13. The data converter of claim 12, further comprising:

a counter controlled by the latch.

14. The data converter of claim 9, further comprising:

an autozero switch coupled between the second source-drain terminal and a gate terminal of the common source amplifier transistor.

15. The data converter of claim 9, further comprising:

a filter capacitor coupled across the first and second source-drain terminals of the common source amplifier transistor.

16. The data converter of claim 9, further comprising:

a voltage clamping circuit directly coupled to the second source-drain terminal of the common source amplifier transistor and configured to selectively pull down the output signal.

17. A data converter operable with an image sensor pixel, comprising:

a first comparison stage having a single-ended input transistor, the first comparison stage configured to receive a signal, via a pixel output line, from the image sensor pixel and to generate a corresponding output signal; and a second comparison stage configured to receive the output signal from the first comparison stage, wherein the first comparison stage comprises:

a filter capacitor having a first terminal coupled to the pixel output line; and a voltage clamp having a first terminal coupled to a second terminal of the filter capacitor and having a second terminal coupled to a power supply line.

18. The data converter of claim 17, wherein the single-ended input transistor is coupled in parallel with the filter capacitor and configured to receive a ramp voltage.

19. The data converter of claim 18, wherein the first comparison stage further comprises:

a first current source transistor coupled between the voltage clamp and the power supply line; and a second current source transistor coupled between the first current source transistor and the second terminal of the filter capacitor.

20. The data converter of claim 19, wherein the first comparison stage further comprises:

a third current source transistor coupled in parallel with the filter capacitor.

* * * * *